(12) United States Patent
Otani

(10) Patent No.: US 8,218,777 B2
(45) Date of Patent: Jul. 10, 2012

(54) MULTIPOINT COMMUNICATION APPARATUS

(75) Inventor: Takeshi Otani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1003 days.

(21) Appl. No.: 12/155,828

(22) Filed: Jun. 10, 2008

(65) Prior Publication Data

US 2008/0304673 A1  Dec. 11, 2008

(30) Foreign Application Priority Data

Jun. 11, 2007 (JP) ................. 2007-153789

(51) Int. Cl.
*H04R 29/00* (2006.01)
(52) U.S. Cl. ......................... 381/56; 381/94.3
(58) Field of Classification Search .......... 381/104, 381/106, 107, 61, 63, 94.1–94.9, 57, 109, 381/56; 84/600, 601, 602, 626, 629
See application file for complete search history.

(56) References Cited

U.S. PATENT DOCUMENTS

| 4,891,837 | A | * | 1/1990 | Walker et al. ............. 379/390.01 |
| 5,839,101 | A | * | 11/1998 | Vahatalo et al. ............... 704/226 |
| 2004/0143433 | A1 | | 7/2004 | Marumoto et al. |
| 2005/0123153 | A1 | | 6/2005 | Toki |
| 2005/0286664 | A1 | | 12/2005 | Chen et al. |

FOREIGN PATENT DOCUMENTS

| JP | 10-161694 | * | 6/1998 |
| JP | 2002-175100 | | 6/2002 |
| JP | 2002-223268 | | 8/2002 |
| JP | 2003-60459 | | 2/2003 |
| JP | 2004-507141 | | 3/2004 |
| JP | 2004-133403 | | 4/2004 |
| JP | 2005-175674 | * | 6/2005 |
| WO | WO 02/15395 A1 | | 2/2002 |

OTHER PUBLICATIONS

European Search Report dated Feb. 26, 2010 and issued in corresponding European Patent Application 08157992.2.
Peter L. Chu., "Voice-Activated AGC for Teleconferencing", IEEE Proceedings ICASSP96, vol. 2, pp. 929-932, 1996.
Japanese Office Action issued on Jun. 8, 2010 in corresponding Japanese Patent Application 2007-153789.
Japanese Office Action for Application No. 2007-153789; dated Sep. 8, 2009.

* cited by examiner

*Primary Examiner* — Xu Mei
*Assistant Examiner* — Lao Lun-See
(74) *Attorney, Agent, or Firm* — Staas & Halsey LLP

(57) ABSTRACT

According to an aspect of an embodiment, a multipoint communication apparatus comprises: a receiving unit for receiving a plurality of signals containing voice signal elements and noise signal elements from the plurality of other communication apparatuses, respectively; a noise estimating unit for estimating the plurality of noise signal elements in the plurality of received signals, respectively; a gain control unit for adjusting gains of the plurality of signals passing therethrough so as to equalize the levels of the plurality of noise signal elements outputted from the gain element on the basis of the estimated levels of the noise signal elements; a combining unit for combining the plurality of signals passed through the gain control unit; and an output unit for outputting a sound signal on the basis of the a combined signal by the combining unit.

7 Claims, 21 Drawing Sheets

Fig. 16

| | S1 | S2 | S2 |
|---|---|---|---|
| VOICE LEVEL (1901) | -10dBov | -30dBov | -40dBov |
| NOISE LEVEL (1902) | -30dBov | -60dBov | -80dBov |

| | | | |
|---|---|---|---|
| SNR (1903) | 20dB | 30dB | 40dB |

| | S1 | S2 | S3 |
|---|---|---|---|
| VOICE LEVEL (1904) | -45dBov | -35dBov | -25dBov |
| NOISE LEVEL (1905) | -65dBov | -65dBov | -65dBov |

| | S1 | S2 | S3 |
|---|---|---|---|
| VOICE LEVEL (1906) | -25dBov | -25dBov | -25dBov |
| NOISE LEVEL (1907) | -65dBov | -65dBov | -65dBov |

| | S1 |
|---|---|
| VOICE LEVEL (1908) | -25dBov |
| NOISE LEVEL (1909) | -65dBov |

Fig. 17

| | S1 | S2 | S3 |
|---|---|---|---|
| VOICE LEVEL (2001) | -10dBov | -30dBov | -40dBov |
| NOISE LEVEL (2002) | -30dBov | -60dBov | -80dBov |

| | S1 | S2 | S3 |
|---|---|---|---|
| VOICE LEVEL (2003) | -25dBov | -25dBov | -25dBov |
| NOISE LEVEL (2004) | -45dBov | -55dBov | -65dBov |

| | S1 |
|---|---|
| VOICE LEVEL (2005) | -25dBov |
| NOISE LEVEL (2006) | -45dBov |

US 8,218,777 B2

MULTIPOINT COMMUNICATION APPARATUS

BACKGROUND OF THE INVENTION

1. Field of the Invention

The present invention relates to a sound volume control unit and a method for automatically adjusting sound volume of sound signals.

2. Description of the Related Art

A multi-point speech system for speaking among two or more points by using cellular phones, IP (Internet Protocol) telephones, television conference systems and the like has come to be used lately. In such multi-point speech system, sound volume of receiving signals may differ per point due to sensitivity of microphones of transmitting-side units of the respective points even if reproducing volume of a receiving-side unit is set at certain level.

FIG. 19 shows an exemplary configuration of such multi-point speech system. Transmitting-side telephones 101 and 102 as well as a receiving-side telephone 104 are connected to a communication network 103. The telephone 104 receives a voice signal S1 from the telephone 101 and a voice signal S2 from the telephone 102 and a speaker 105 converts output signals and outputs as voice.

When volume of the voice signal S1 is large and volume of the voice signal S2 is small at this time, volume of the voices outputted out of the speaker 105 differs between those from the telephone 101 and the telephone 102. Then, it has been desired to automatically adjust the volumes of the receiving signals in order to make the volumes of sounds of the all points even.

FIG. 20 shows a prior art sound volume control method using automatic gain controls (AGC). The AGC is a function for automatically adjusting an amplification factor (gain) of an amplifying circuit so that volume of an output is adjusted to a desirable level even when amplitude of an input signal fluctuates.

A mixer 203 performs mixing (addition) in this volume control method after leveling the volumes of the receiving signals S1 and S2 of the respective points by the AGCs 201 and 202, respectively. Thereby, it becomes possible to correct the difference between the volumes of the points. Various configurations have been proposed as the configuration of the AGCs 201 and 202.

FIG. 21 is a structural view of an AGC described in a non-patent literature, Peter L. Chu, "VOICE-ACTIVATED AGC FOR TELECONFERENCING" proceedings ICASSP96 vol. 2, pp. 929-932, 1996. According to this configuration, a frame electric power calculating section 301 divides an input signal into frames of 20 ms and calculates energy (frame power) within each frame. Next, a maximum value calculating section 302 calculates a maximum value of the frame power from the past to the present time and a gain calculating section 303 calculates a gain from a difference of powers between the maximum value and a target level. Then, a multiplier 304 multiplies the gain with the input signal to generate an output signal.

However, although the volumes of voices of speakers in the output signals of the AGC are almost leveled in all of the points, volume of noise that depends on an ambient environment differs per each point. Still more, a SNR (Signal-to-Noise Ratio) of each point does not change. Accordingly, a SNR of an output signal after mixing is adjusted to a value of a point where the SNR of the receiving signal is least among all of the points. Therefore, when there is such point where the SNR is small, the SNR of all of the points becomes small and it becomes hard to catch the voices.

Japanese Patent Application Laid-open No. 2004-133403 relates to a voice signal processing apparatus that samples voices that form a conversation in a conversation state in which a plurality of voices and noises are mixed and raises an output volume of its voice or lowers a volume of other sounds. Japanese Patent Application Laid-open No. 2004-507141 relates to a method for processing a voice signal to overcome background noise not related to the voice signal, Japanese Patent Application Laid-open No. 2002-223268 relates to a voice control unit for obtaining receiving voice from which a discomfort feeling is eliminated without being buried in an ambient background noise and Japanese Patent Application Laid-open No. 2002-1575100 relates to an adaptive noise suppressing voice coding apparatus that detects and eliminates noises within a present speech.

SUMMARY

According to an aspect of an embodiment, a multipoint communication apparatus comprises: a receiving unit for receiving a plurality of signals containing voice signal elements and noise signal elements from the plurality of other communication apparatuses, respectively; a noise estimating unit for estimating the plurality of noise signal elements in the plurality of received signals, respectively; a gain control unit for adjusting gains of the plurality of signals passing therethrough so as to equalize the levels of the plurality of noise signal elements outputted from the gain element on the basis of the estimated levels of the noise signal elements; a combining unit for combining the plurality of signals passed through the gain control unit; and an output unit for outputting a sound signal on the basis of the a combined signal by the combining unit.

BRIEF DESCRIPTION OF THE DRAWINGS

FIG. 16 illustrates charts showing third volume control of the invention;

FIG. 17 illustrates charts showing prior art third volume control;

DESCRIPTION OF THE PREFERRED EMBODIMENTS

Preferred embodiments for carrying out the invention will be explained below in detail with reference to the drawings.

Figure 1:
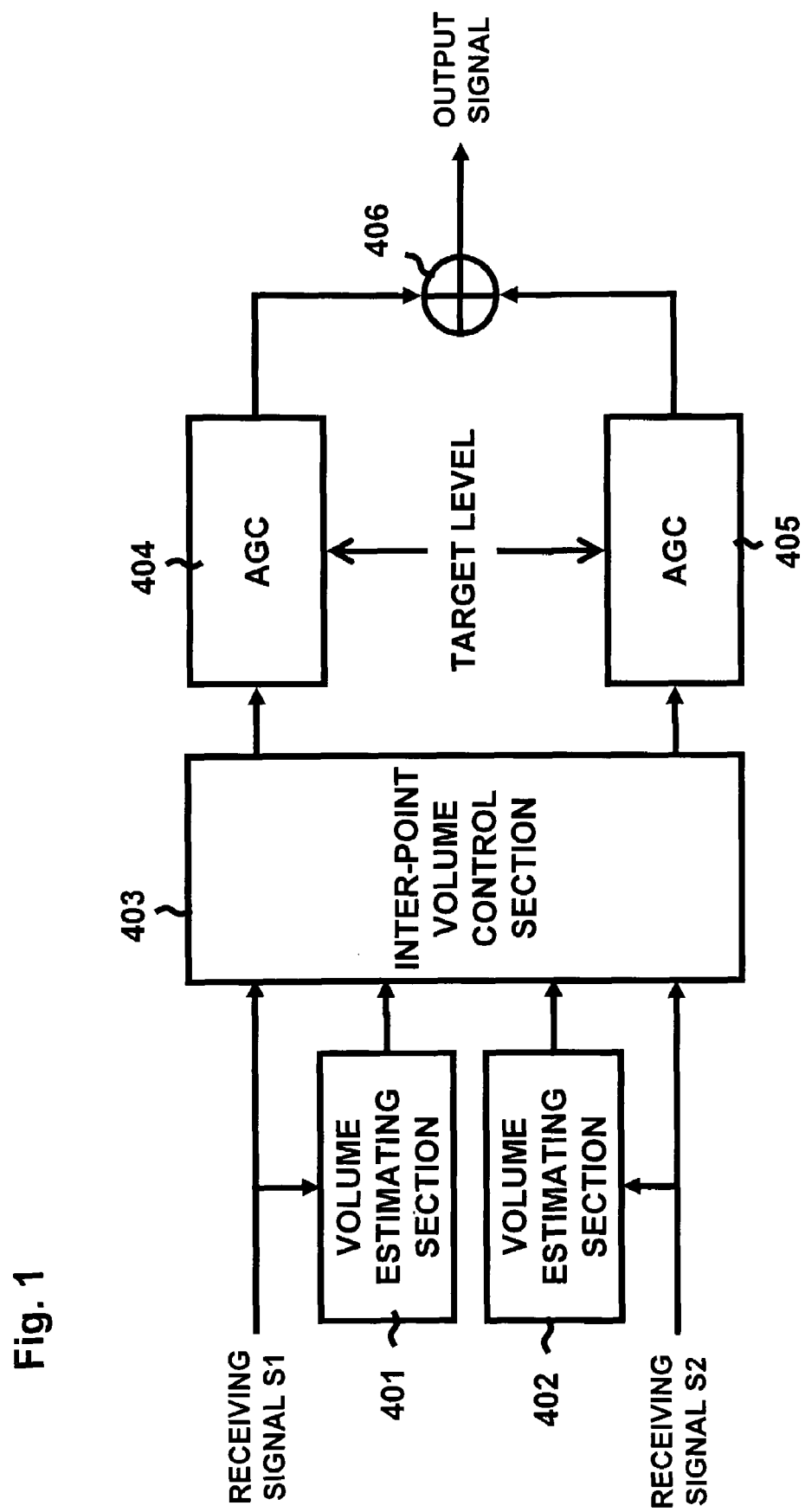
FIG. 1 is a structural view of a first multi-point teleconferencing apparatus.

FIG. 1 shows an exemplary configuration of a sound volume control unit (multi-point teleconferencing apparatus) applied to a multi-point teleconferencing system. A teleconference is carried out among three points in this case. This multi-point teleconferencing apparatus has noise volume estimating sections 401 and 402, an inter-point volume control section 403, AGCs 404 and 405 and a mixer 406 and outputs an output signal by adjusting sound volumes (levels) of receiving signals from two points.

The noise volume estimating sections 401 and 402 calculate levels of noises contained respectively in the receiving signals S1 and S2 and output calculation results to the inter-point volume control section 403. Based on the calculation results of the noise level, the inter-point volume control section 403 controls levels of the receiving signals S1 and S2 so that the noise levels of the receiving signals S1 and S2 are made even and output them to the AGCs 404 and 405, respectively.

The AGCs 404 and 405 adjust gains of the signals outputted out of the inter-point volume control section 403 to a target level and the mixer 406 performs mixing on the output signals from the AGCs 404 and 405 and then outputs an output signal.

Figure 2:
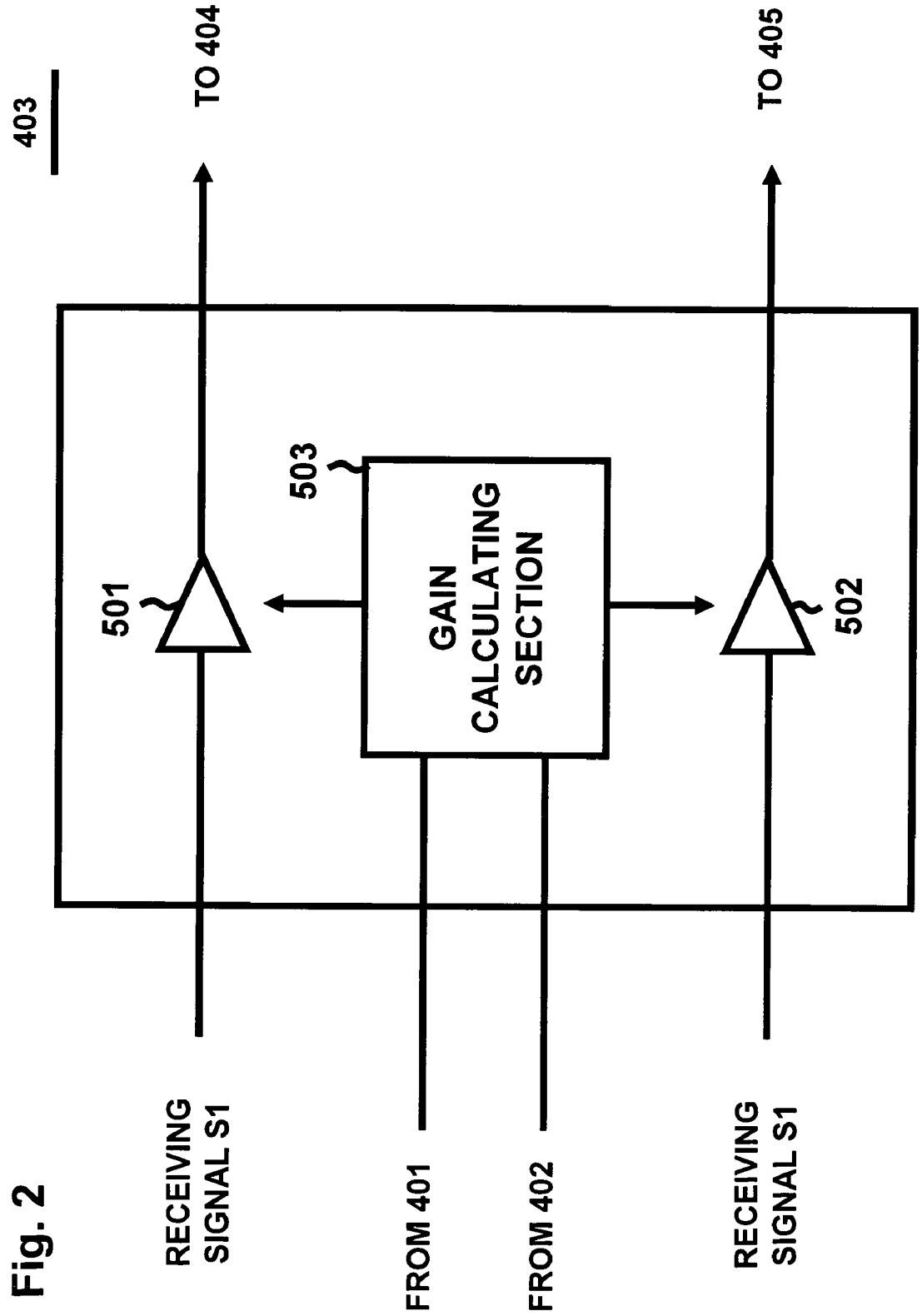
FIG. 2 is a structural view of an inter-point sound volume control section.

FIG. 2 shows an exemplary configuration of the inter-point volume control section 403 in FIG. 1. The inter-point volume control section 403 has amplifiers 501 and 502 and a gain calculating section 503. The amplifiers 501 and 502 amplify the receiving signals S1 and S2, respectively, and output them to the AGCs 404 and 405. The gain calculating section 503 adjusts gains of the amplifiers 501 and 502 based on the calculation results of the noise volume estimating sections 401 and 402.

The gain calculating section 503 calculates the gains of the amplifiers 501 and 502 so as to adjust the noise level of each receiving signal to a reference level of noise level of a point having a highest SNR and sets the obtained gain to each of the amplifiers. It facilitates to catch a voice of the point where the SNR is large and the voice levels are made even among the points. It is noted that a minimum value of the noise levels or a predetermined noise level of the plurality of points may be used as the reference level instead of the noise level of the point having the highest SNR.

Figure 3:
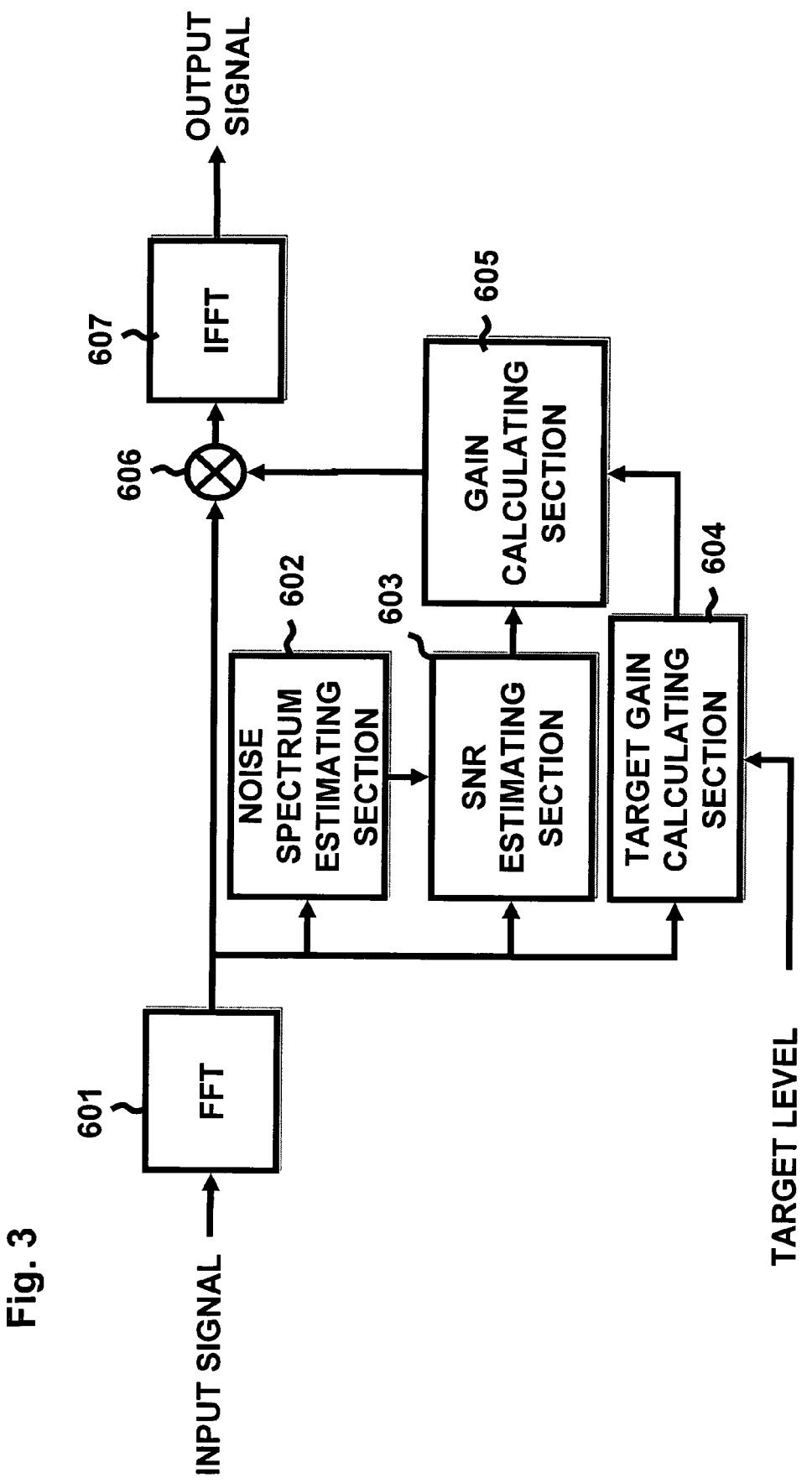
FIG. 3 is a structural view of a first AGC.

FIG. 3 shows an exemplary configuration of the AGCs 404 and 405 in FIG. 1. This AGC includes a fast Fourier transforming section 601 (FFT), a noise spectrum estimating section 602, a SNR estimating section 603, a target gain calculating section 604, a gain calculating section 605, a multiplier 606 and an inverse fast Fourier transforming section 607 (IFFT) and controls an amplification amount of each band corresponding to the SNR and a target level in a frequency domain. Each domain corresponds to each discrete value of the frequency for example.

The FFT 601 transforms the input signal from a temporal domain to the frequency domain by orthogonal transformation to find a power spectrum (input spectrum) of input sounds. Specifically, the FFT 601 divides the input signal into a plurality of bands to calculate a band signal of each band and finds the power per band from each band signal to calculate the input spectrum.

The noise spectrum estimating section 602 outputs a spectrum of non-voice section containing only noise signals in the input spectrum as a noise spectrum and the SNR estimating section 603 finds a SNR spectrum that is a ratio between the input spectrum and the noise spectrum. The SNR spectrum represents the SNR of each band.

The target gain calculating section 604 calculates a target gain so that volume of the output signal is adjusted to the target level from the input spectrum and the target level and the gain calculating section 605 calculates a gain of each band from the target gain and the SNR spectrum. At this time, the gain calculating section 605 calculates the gain of each band so that the gain is adjusted to the target gain in the band whose SNR is high and so that the gain is adjusted to 1 in the band whose SNR is low, i.e., so as not to be amplified.

The multiplier 606 multiplies the gain of each band with each band of the input spectrum to adjust the level of each band. The IFFT 607 generates an output signal by transforming the input signal from the frequency domain to the temporal domain by orthogonal inverse transformation.

Such AGC allows only voice components whose SNR is high to be adjusted to the target level without changing the noise components whose SNR is low.

Figure 4:
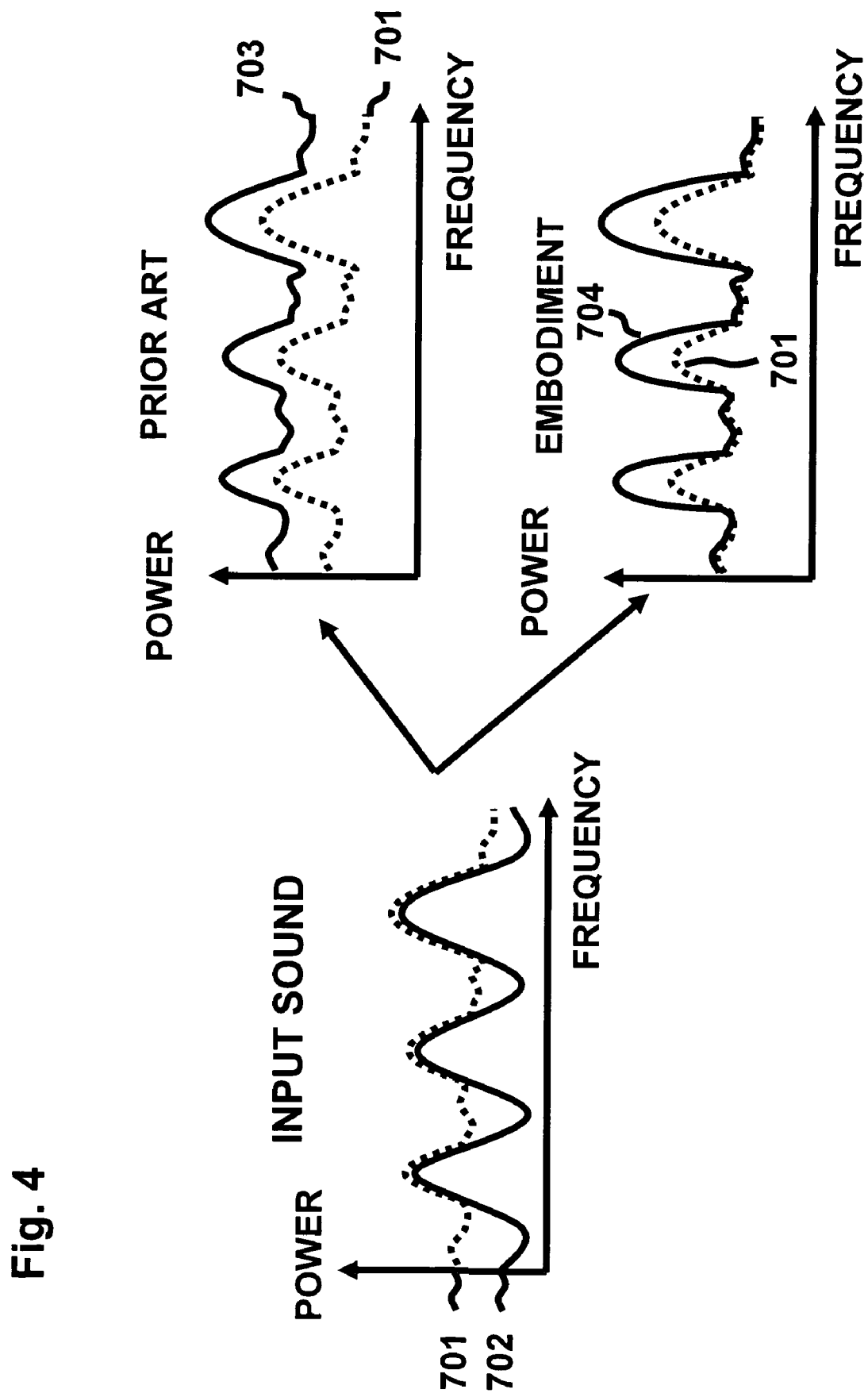
FIG. 4 illustrates charts showing power spectrums of a voice section.

FIG. 4 shows power spectrums of a voice section containing voices, other than noise, such as a voice of a speaker. A power spectrum 701 of the input sound of the AGC contains a power spectrum 702 of the voice component.

Figure 21:
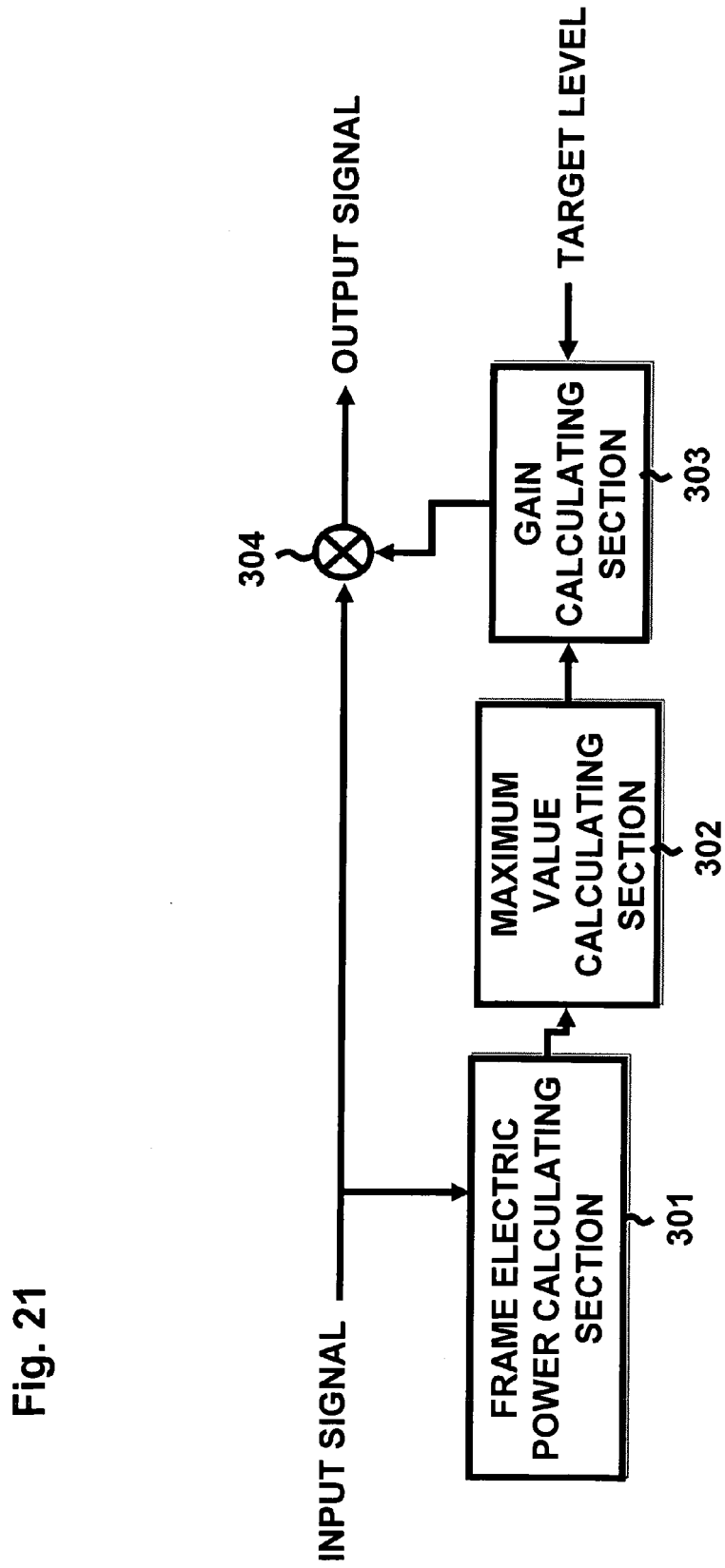
FIG. 21 is a structural view of a prior art AGC.

The power spectrum 701 changes like a power spectrum 703 in the prior art AGC shown in FIG. 21 because the whole band is amplified homogeneously. In this case, the noise component is also amplified together with the voice component and sound offensive to ears is outputted. In addition to that, fluctuation of the level of the noise component occurs, causing sound more offensive to the ears, because the gain changes between the voice section and the non-voice section.

In contrary to that, the power spectrum 701 changes like a power spectrum 704 in the AGC in FIG. 3 because the bands whose SNR is low are not amplified and only the bands whose SNR is high are selectively amplified. Accordingly, it becomes possible to amplify only the voice components without amplifying the noise components.

Figure 5:
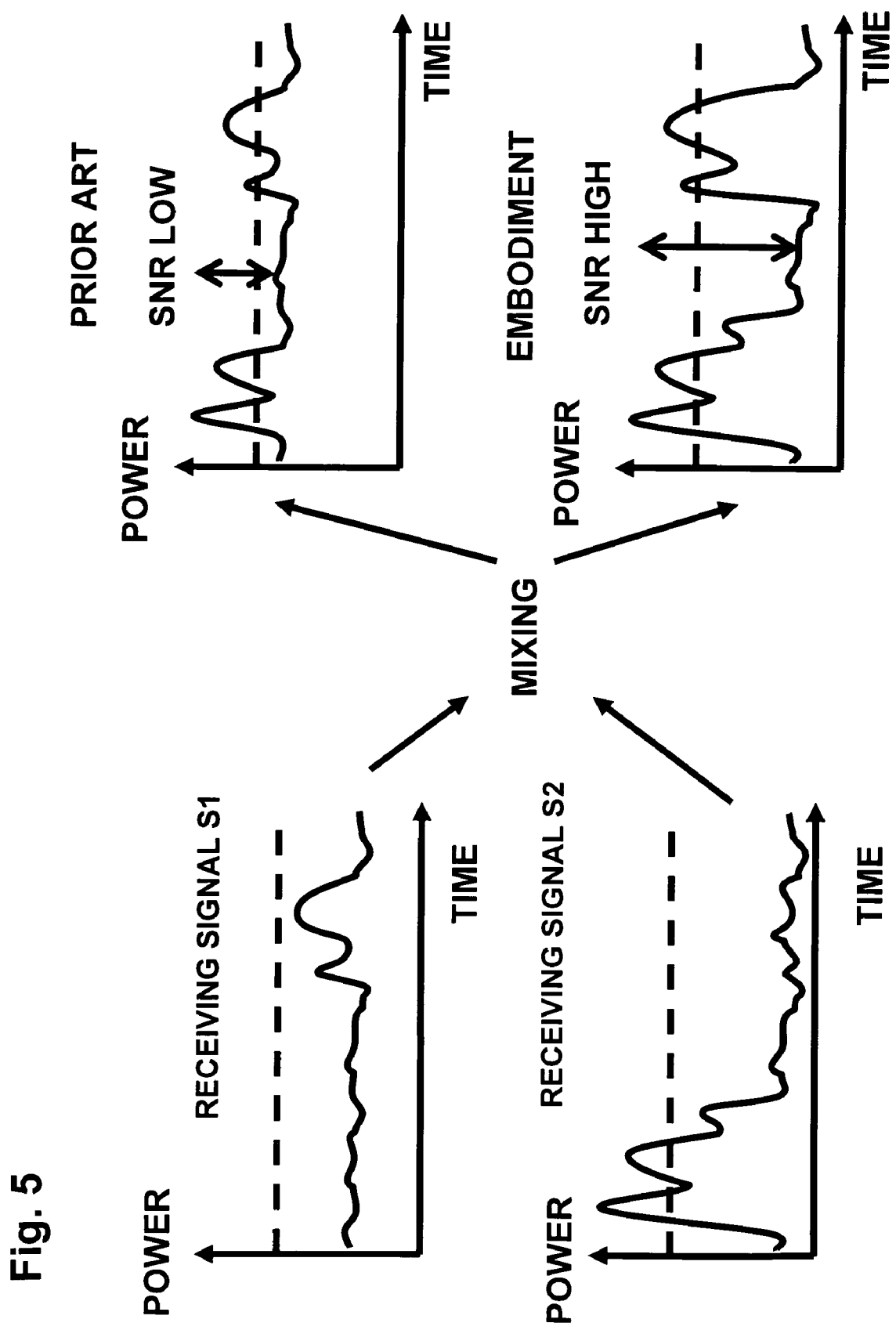
FIG. 5 illustrates charts showing powers after mixing.

FIG. 5 shows powers of the output signals after mixing the receiving signals of the two points. Although the sound level becomes constant by adjusting the receiving signals S1 and S2 by the AGCs in the prior art volume control method shown in FIG. 20, the SNR after mixing becomes low. In contrary to that, the SNR after mixing becomes large as compared to the prior art in the volume control method in FIG. 1 by applying the AGC after adjusting the noise levels between the points.

Although FIG. 1 shows the case when the receiving signals from the two points are processed, the same applies to a case when receiving signals of three or more points are processed.

Figure 6:
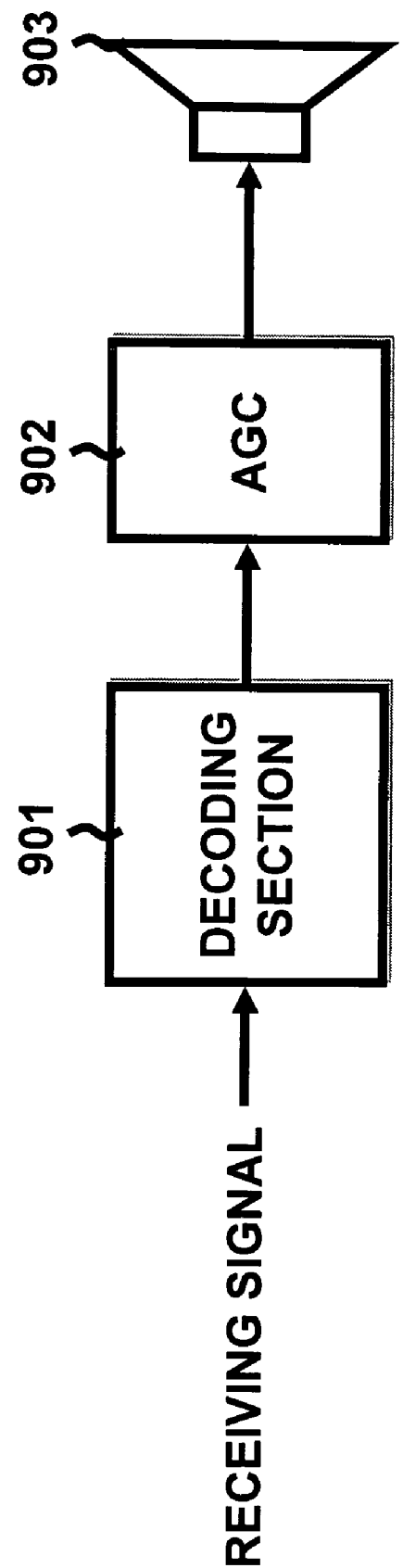
FIG. 6 is a structural view of a receiving section of a cellular phone.

FIG. 6 shows an exemplary configuration of a case when the AGC in FIG. 3 is applied to a receiving section of a cellular phone. A decoding section 901 decodes a receiving signal and outputs it to an AGC 902 and the AGC 902 adjusts a gain of the signal outputted out of the decoding section 901 and outputs it to a speaker 903.

Figure 7:
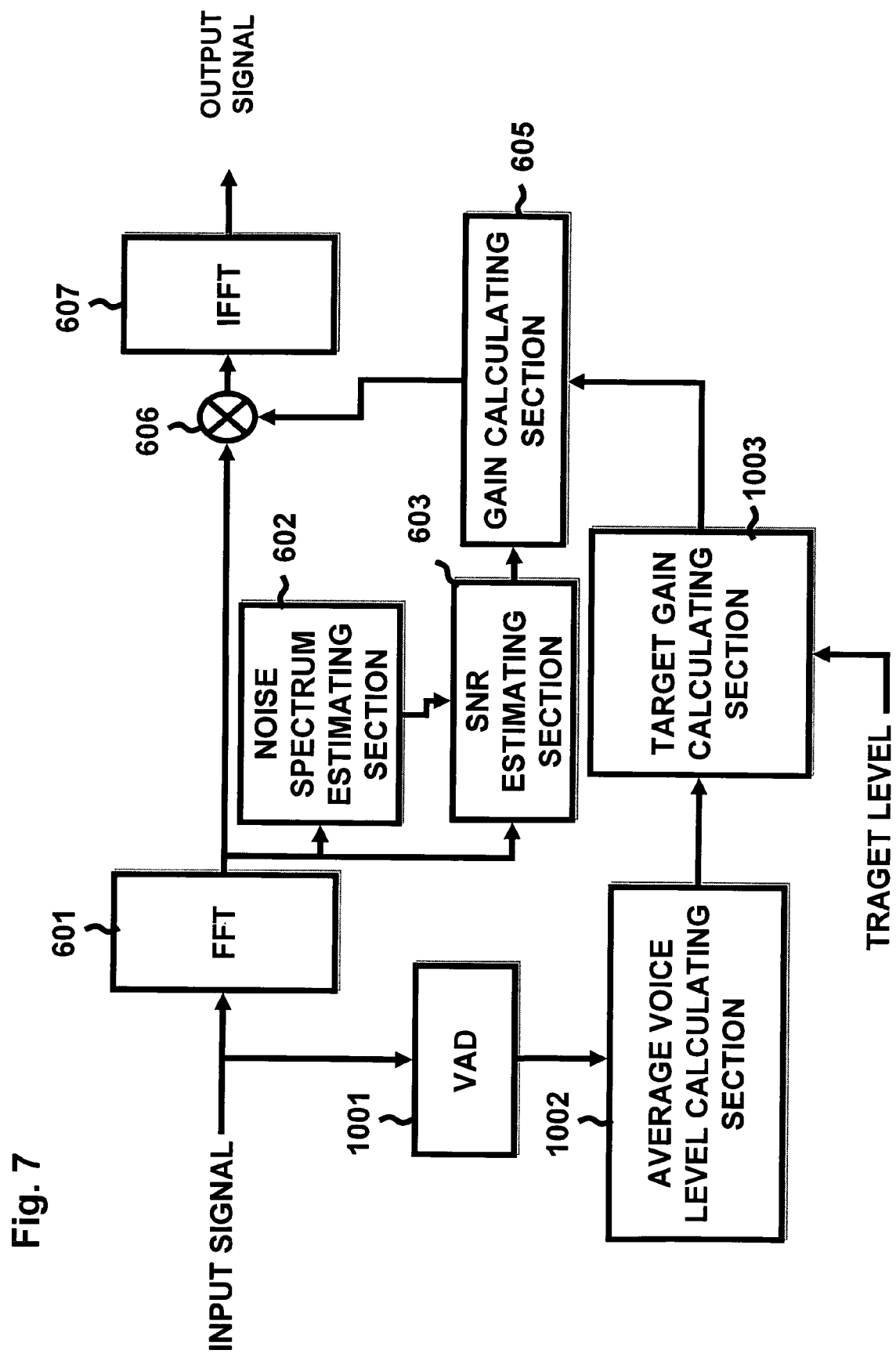
FIG. 7 is a structural view of a second AGC.

FIG. 7 shows an exemplary configuration of the AGC 902 in FIG. 6. This AGC has the FFT 601, the noise spectrum estimating section 602, the SNR estimating section 603, the gain calculating section 605, the multiplier 606, the IFFT 607, a voice action detecting section 1001 (VAD), an average voice level calculating section 1002 and a target gain calculating section 1003.

The VAD 1001 detects voice sections and non-voice sections from an input signal and the average voice level calculating section 1002 calculates an average voice level from an average level of the voice sections. The target gain calculating section 1003 calculates a target gain G0 from a ratio between the average voice level and a target level.

The FFT 601 calculates an input spectrum by performing the FFT on the input signal. The noise spectrum estimating section 602 detects the voice sections and the non-voice sections by detecting a speech action from the input spectrum and calculates a noise spectrum from an average level of the non-voice sections. The SNR estimating section 603 calculates a SNR spectrum from the input spectrum and the noise spectrum.

The gain calculating section 605 calculates a gain G(i) from an i-th band from the target gain G0 and the SNR spectrum by the following expression:

$$G(i) = G0 \times \beta(i) \ (i=1, 2, \ldots, n)$$

Where, the i-th factor $\beta(i)$ is determined corresponding to the SNR of the i-th band contained in the SNR spectrum.

Figure 8:
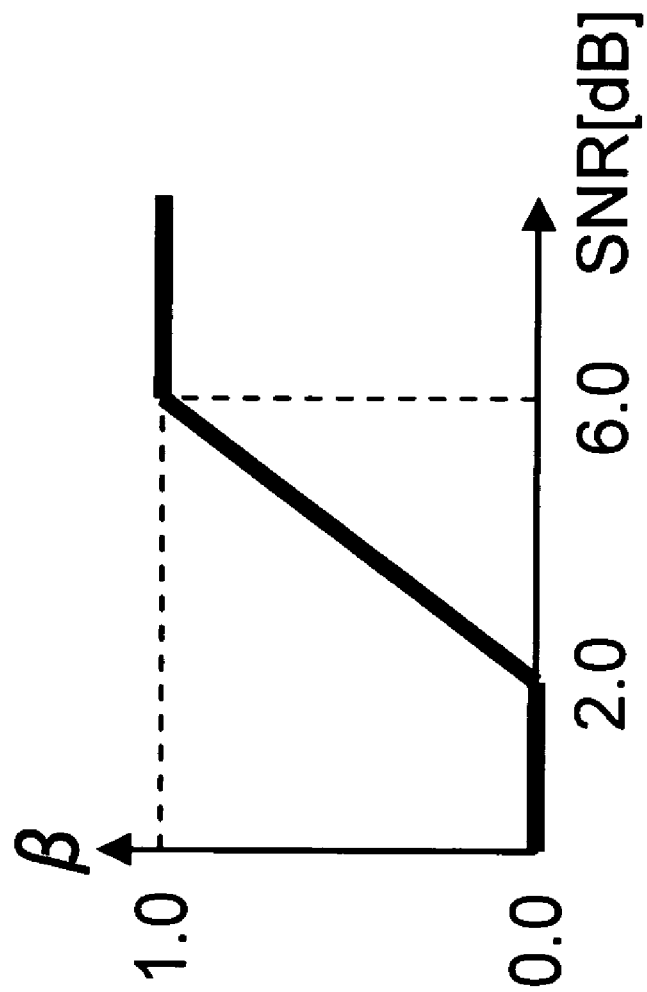
FIG. 8 is a graph showing a relationship between a multiplication factor and SNR.

$\beta(i)$ takes a value as shown in FIG. 8 for example when G0 and G(i) are represented by logarithmic gain. In this case, $\beta(i)$ of the band whose SNR is 0 to 2 dB is zero and $\beta(i)$ of the band whose SNR exceeds 6 dB is 1. $\beta(i)$ of the band whose SNR is 2 to 6 dB assumes a value from zero to 1. Accordingly, G(i) of the band whose SNR is 0 to 2 dB turns out to be 0, G(i) of the band whose SNR exceeds 6 dB coincides with G0 and G(i) of the band whose SNR is 2 to 6 dB assumes a value from 0 to G0.

The multiplier 606 multiplies G(i) with the power of the i-th band in the input spectrum to calculate an output spectrum and the IFFT 607 perform the IFFT on the output spectrum to generate an output signal.

Figure 9:
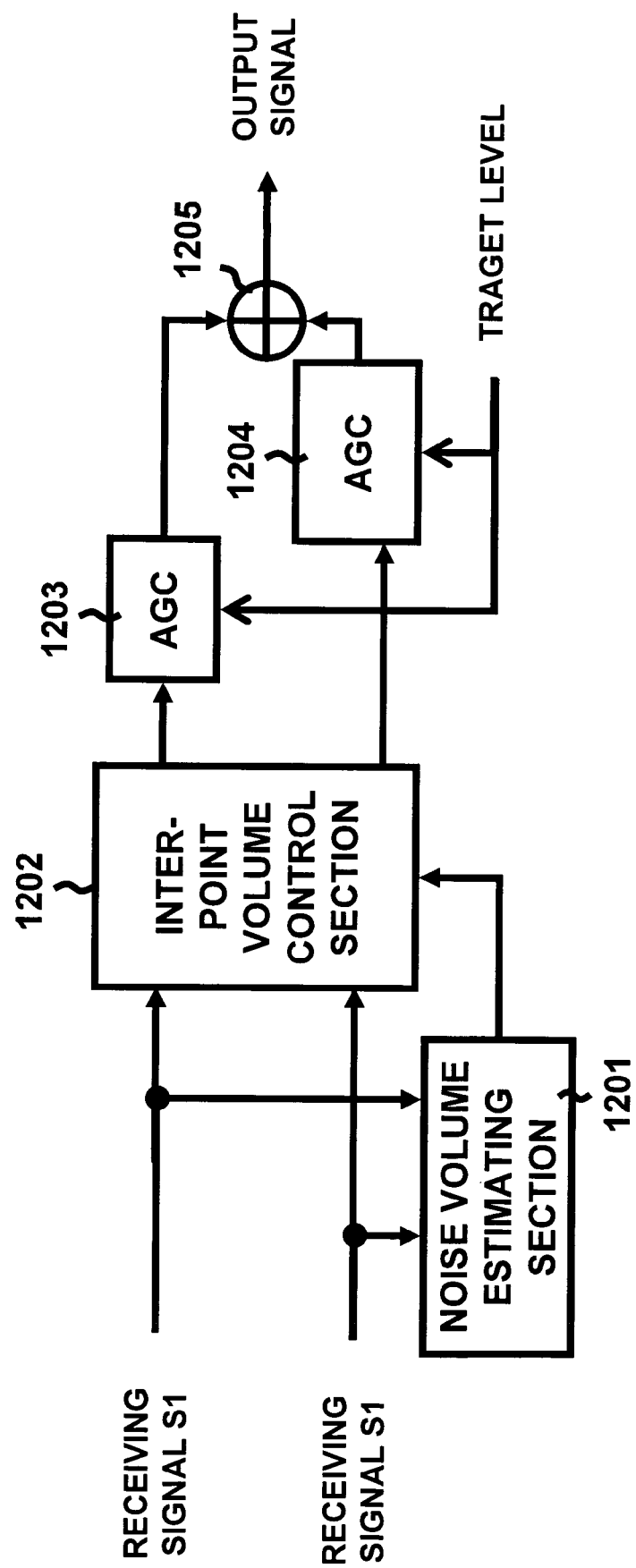
FIG. 9 is a structural view of a second multi-point teleconferencing apparatus.

FIG. 9 shows an exemplary configuration in which the AGC in FIG. 7 is applied to the multi-point teleconferencing apparatus. A teleconference is carried out among three points in this case. The multi-point teleconferencing apparatus has a noise volume estimating section 1201, an inter-point volume control section 1202, AGCs 1203 and 1204 and a mixer 1205.

An operation of the noise volume estimating section 1201 is the same with the noise volume estimating sections 401 and 402 in FIG. 1 and operations of the inter-point volume control section 1202 and the mixer 1205 are the same with those of the inter-point volume control section 403 and the mixer 406 in FIG. 1. The AGCs 1203 and 1204 have the same configuration with that shown in FIG. 7.

Figure 10:
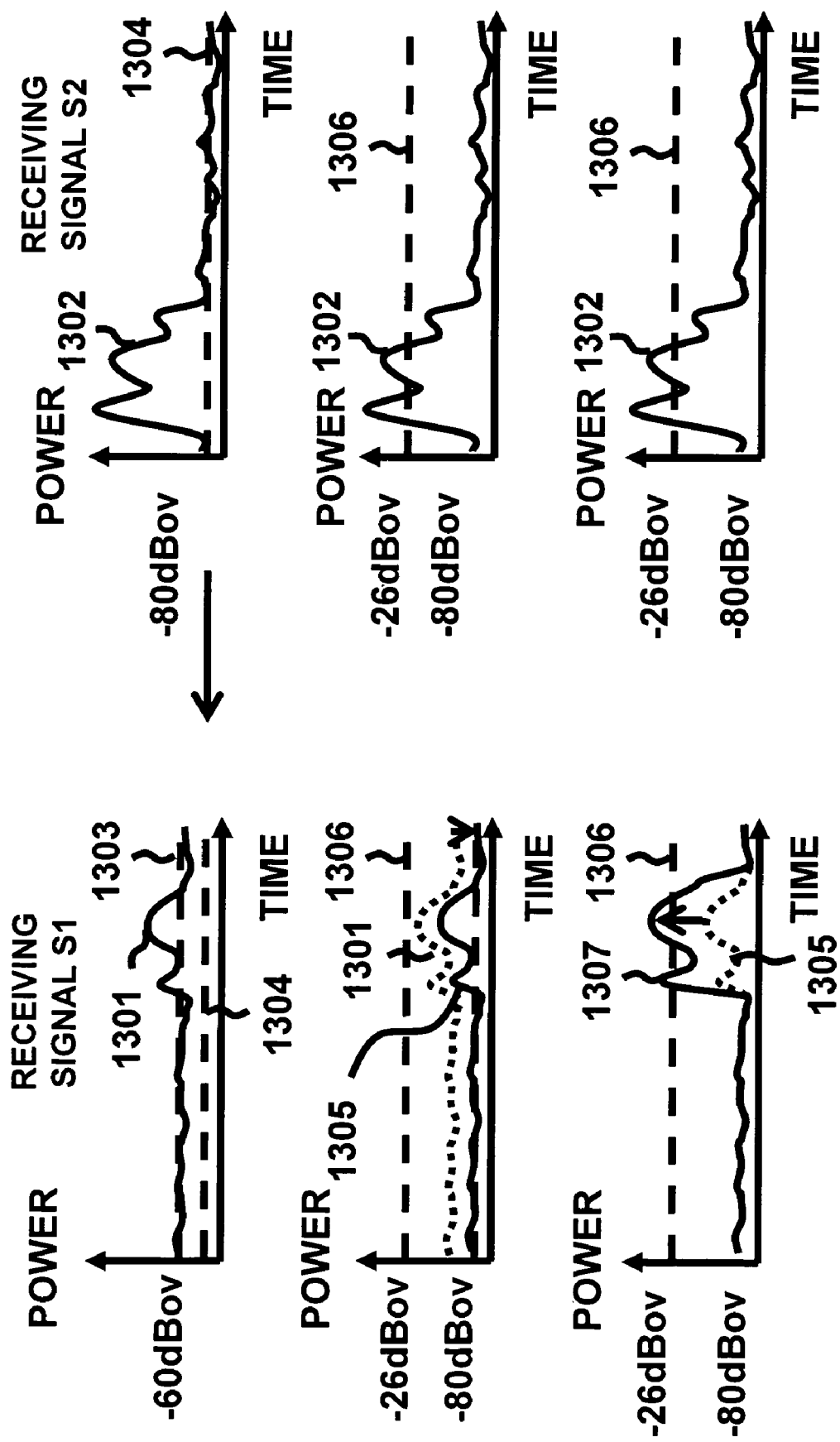
FIG. 10 illustrates charts showing first volume control of the invention.

FIG. 10 illustrates exemplary sound control in the multi-point teleconferencing apparatus in FIG. 9. The noise volume estimating section 1201 calculates a noise level of each point at first. The noise volume estimating section 1201 calculates a noise level 1303 (−60 dBov) from power 1301 of the receiving signal S1 and calculates a noise level 1304 (−80 dBov) from power 1302 of the receiving signal S2. In this case, the noise level 1304 corresponds to a minimum value of the noise level.

Then, the inter-point volume control section 1202 attenuates the receiving signal S1 so that the noise level 1303 coincides with the noise level 1304. Thereby, the power 1301 of the receiving signal S1 changes like power 1305.

Next, the AGC 1203 amplifies only the voice components of the receiving signal S1 to a target level 1306 (−26 dBov) Thereby, the power 1305 of the receiving signal S1 changes like power 1307. Meanwhile, the voice components of the receiving signal S2 have been already reaching to the target level 1306.

Next, the mixer 1205 generates the output signal by mixing adjusted signals from the AGCs 1203 and 1204. A voice level of the generated output signal is −26 dBov and a noise level thereof is −80 dBov.

Figure 11:
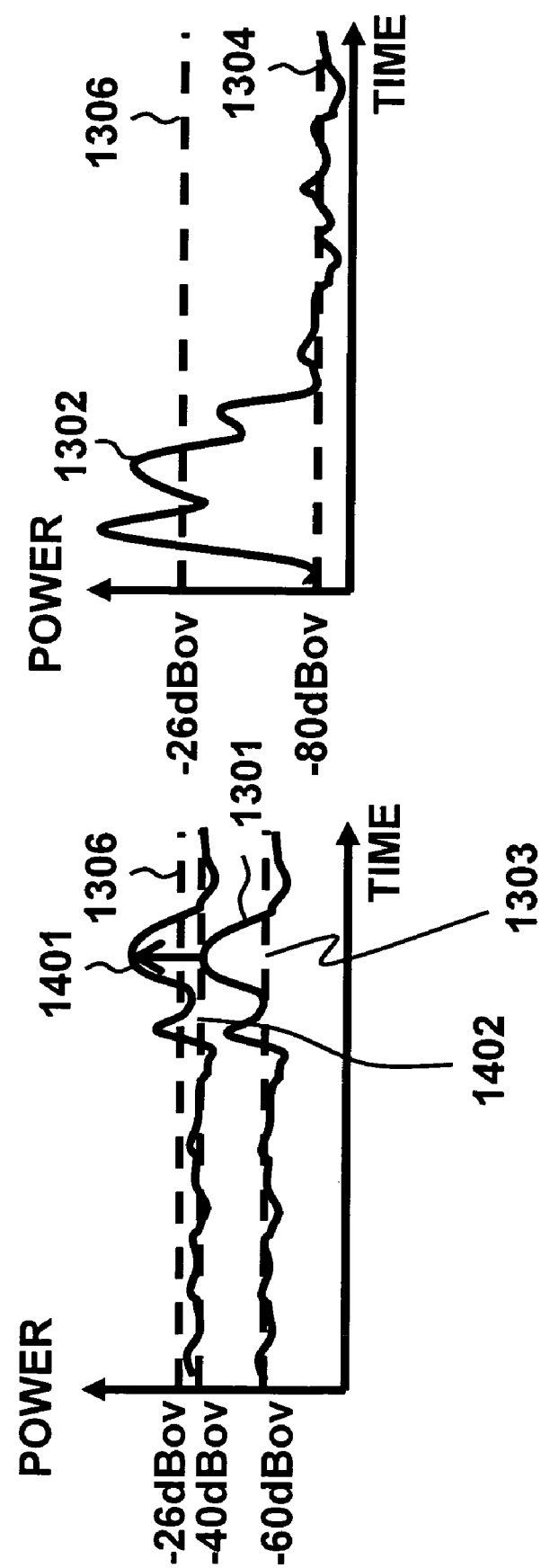
FIG. 11 illustrates charts showing prior art first volume control.
Figure 20:
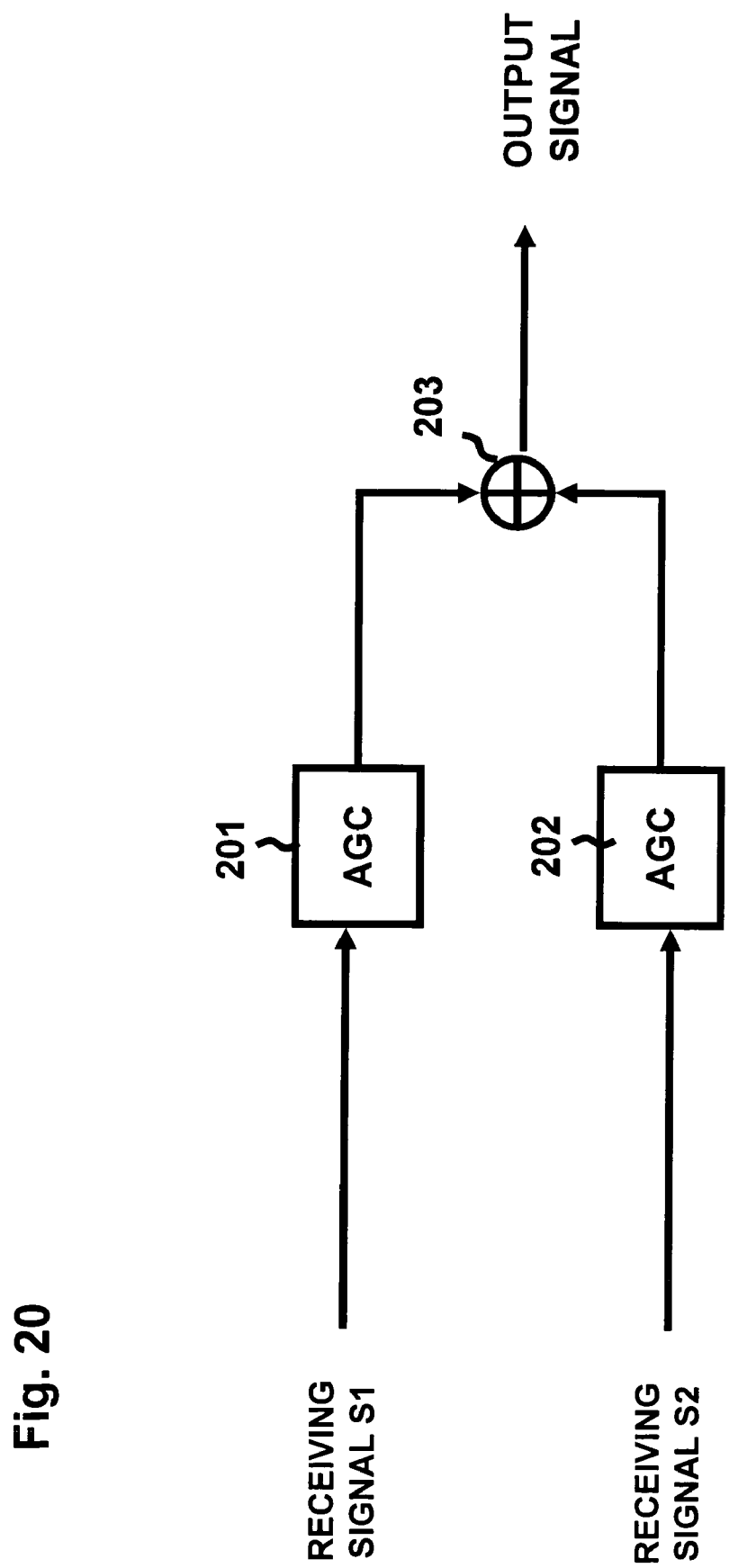
FIG. 20 is a structural view of a prior art sound volume control method.

In contrary to that, according to the prior art volume control method shown in FIG. 20, the AGC 201 amplifies the receiving signal S1 to the target level 1306 as shown in FIG. 11. Thereby, the power 1301 of the receiving signal S1 changes like power 1401 and a noise level 1303 rises to a noise level 1402 (−40 dBov).

Next, the mixer 203 outputs the output signal by mixing the adjusted signals from the AGCs 201 and 202. A voice level of the generated output signal is −26 dBov and a noise level is −40 dBov.

Thus, although the noise level after mixing is −40 dBov in the prior art, it is −80 dBov in the invention and the apparatus of the invention can lower the noise level.

Figure 12:
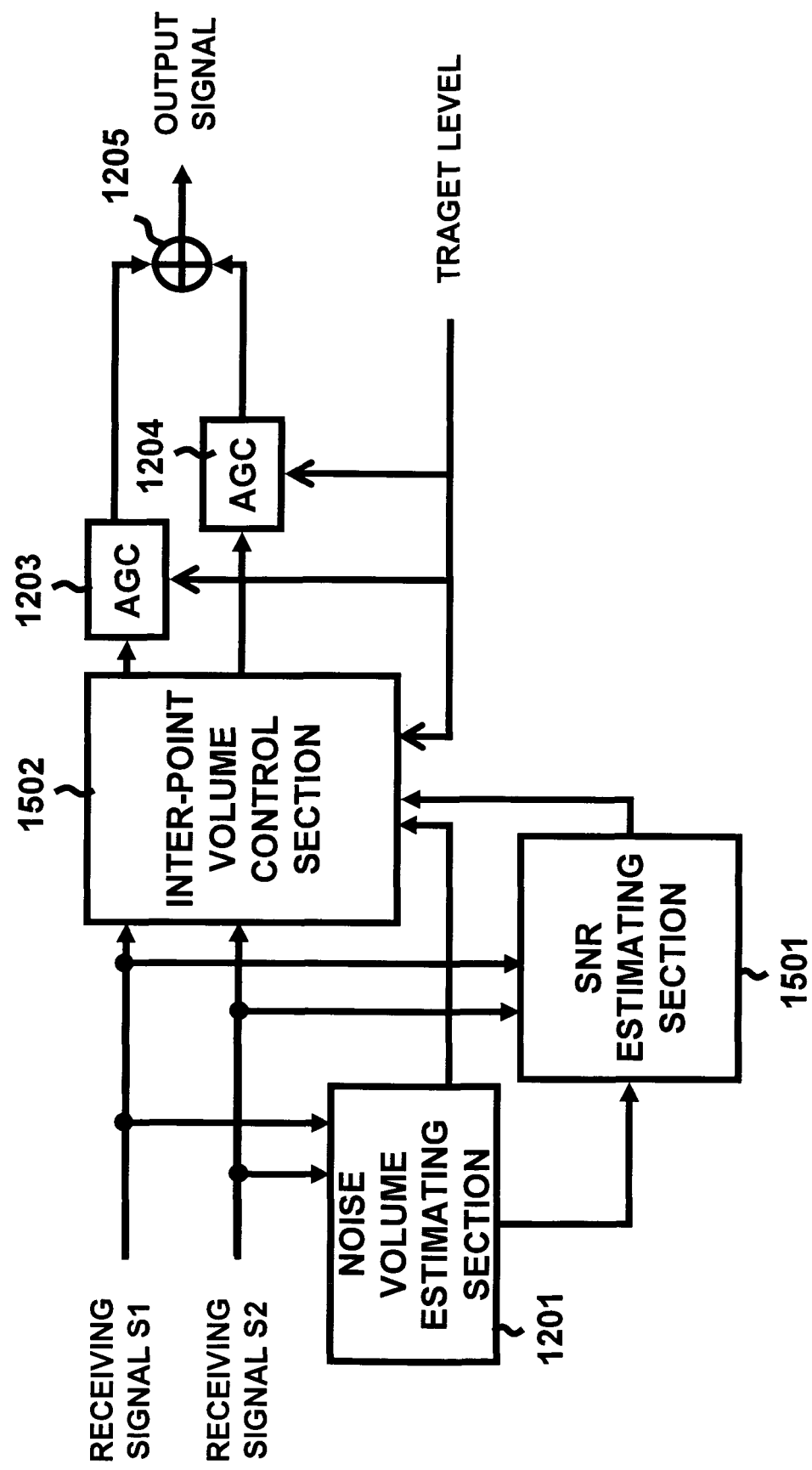
FIG. 12 is a structural view of a, third multi-point teleconferencing apparatus.

FIG. 12 shows another exemplary configuration of the multi-point teleconferencing apparatus. This multi-point teleconferencing apparatus has a configuration in which the inter-point volume control section 1202 in the configuration in FIG. 9 is replaced with an inter-point volume control section 1502 and a SNR estimating section 1501 is added.

The SNR estimating section 1501 calculates SNRs of the receiving signals S1 and S2 and outputs them to the inter-point volume control section 1502. The inter-point volume control section 1502 finds a maximum value of the SNRs from the SNR estimating section 1501 and calculates a target noise level from a difference between the maximum value of the SNR and a target level. Then, the inter-point volume control section 1502 adjusts the level of the receiving signal of each point so that the noise levels of all of the points are adjusted to the target level.

Figure 13:
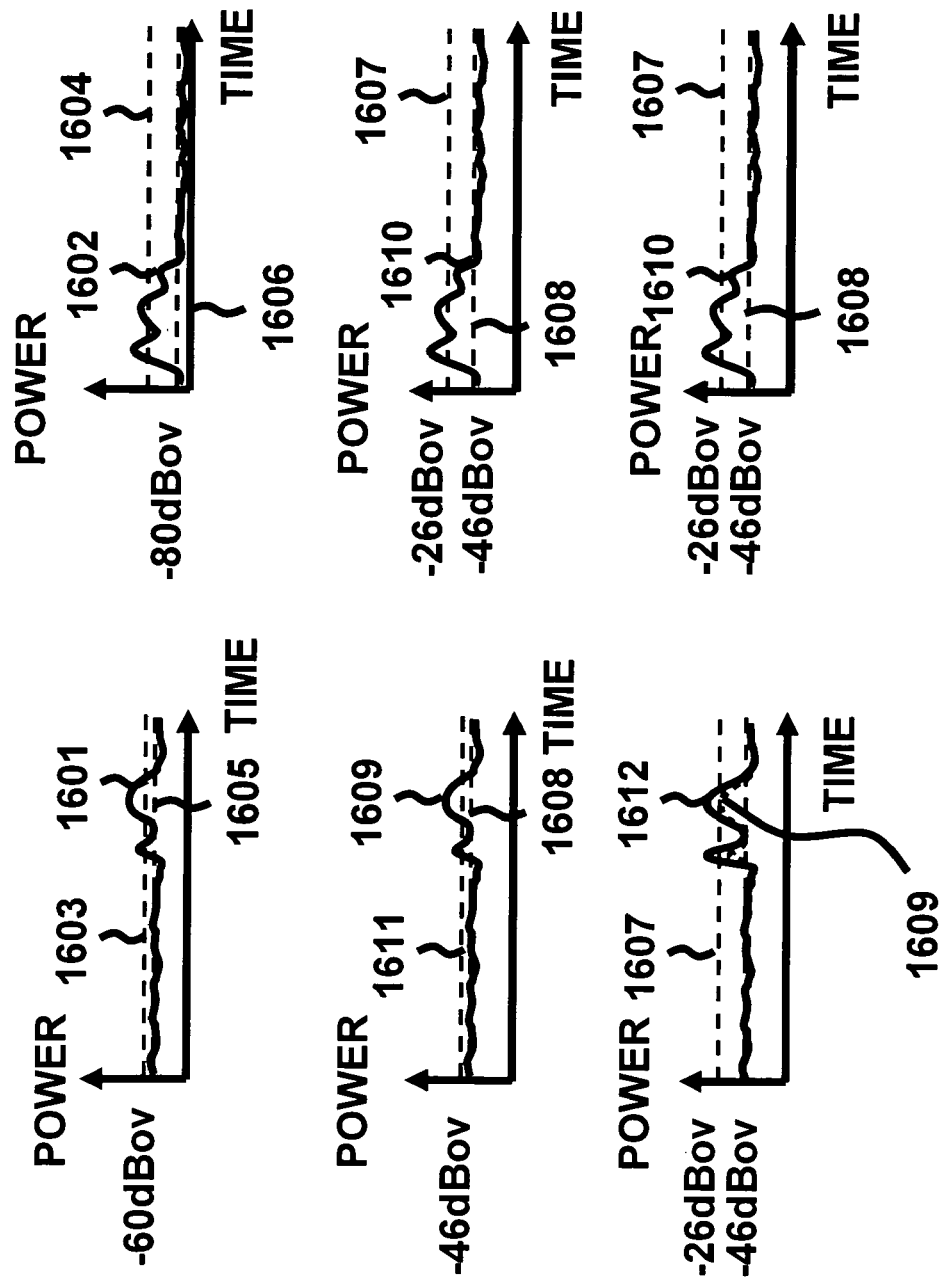
FIG. 13 illustrates charts showing second volume control of the invention.

FIG. 13 shows an exemplary volume control of the multi-point teleconferencing apparatus in FIG. 12. The noise volume estimating section 1201 calculates a noise level of each point at first and the SNR estimating section 1501 calculates SNR of each point. They calculate a voice level 1603 (−50 dBov) and a noise level 1605 (−60 dBov) from power 1601 of the receiving signal S1, and the SNR of the receiving signal S1 turns out to be 10 dB. They also calculate a voice level 1604 (−60 dBov) and a noise level 1606 (−80 dBov) from power 1602 of the receiving signal S2 and, the SNR of the receiving signal S2 turns out to be 20 dB.

Next, the inter-point volume control section 1502 calculates a target noise level 1608 (−46 dBov) by subtracting the maximum value 20 dB of the SNR from a target level 1607 (−26 dBov). Then, the receiving signals S1 and S2 are amplified respectively so that the noise levels 1606 and 1606 coincide with the target noise level 1608. Thereby, the power 1601 of the receiving signal S1 changes like power 1609 and a voice level 1611 thereof turns out to be −36 dBov. The power 1602 of the receiving signal S2 changes like power 1610 and a voice level thereof coincides with the target level 1607 (−26 dBov).

Next, the AGC 1203 amplifies only the voice component of the receiving signal S1 to the target level 1607 (−26 dBov). Thereby, the power 1609 of the receiving signal S1 changes like power 1612. Meanwhile, the voice component of the receiving signal S2 has been already reaching to the target level 1607.

Next, the mixer 1205 generates the output signal by mixing adjusted signals from the AGCs 1203 and 1204. A sound level of the generated output signal is −26 dBov and a noise level thereof is −46 dBov.

Figure 14:
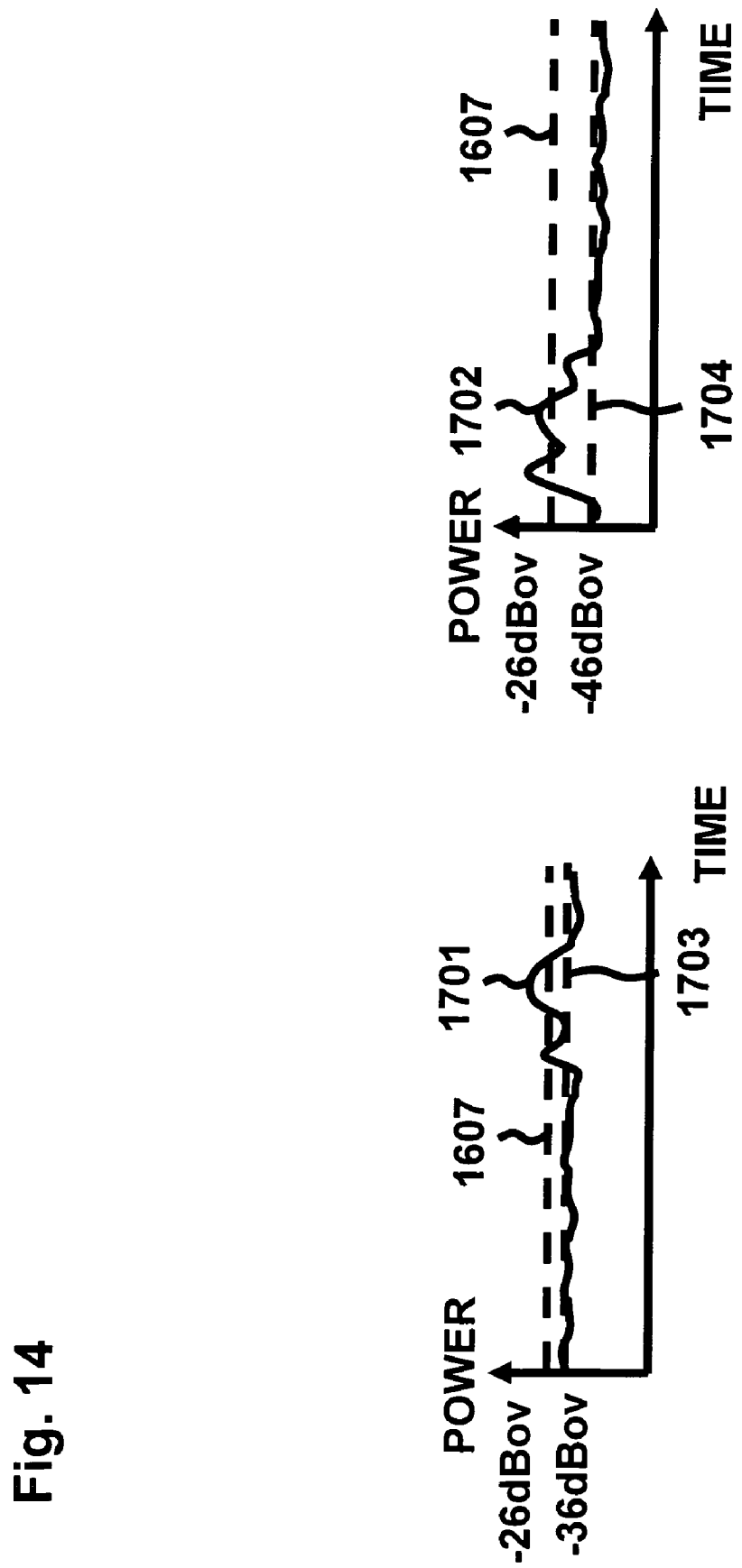
FIG. 14 illustrates charts showing prior art second volume control.

In contrary to that, according to the prior art volume control method shown in FIG. 20, the AGC 201 amplifies the receiving signal S1 to the target level 1607 as shown in FIG. 14 and the AGC 202 amplifies the receiving signal S2 to the target level 1607. Thereby, power 1601 of the receiving signal S1 changes like power 1701 and a noise level 1605 rises to a noise level 1703 (−36 dBov). Also, power 1602 of the receiving signal S2 changes like power 1702 and a noise level 1606 rises to a noise level 1704 (−46 dBov).

Next, the mixer 203 outputs the output signal by mixing the adjusted signals from the AGCs 201 and 202. A voice level of the generated output signal is −26 dBov and a noise level is −36 dBov.

Thus, although the noise level after mixing is −36 dBov in the prior art, it is −46 dBov in the invention and the apparatus of the invention can lower the noise level.

Figure 15:
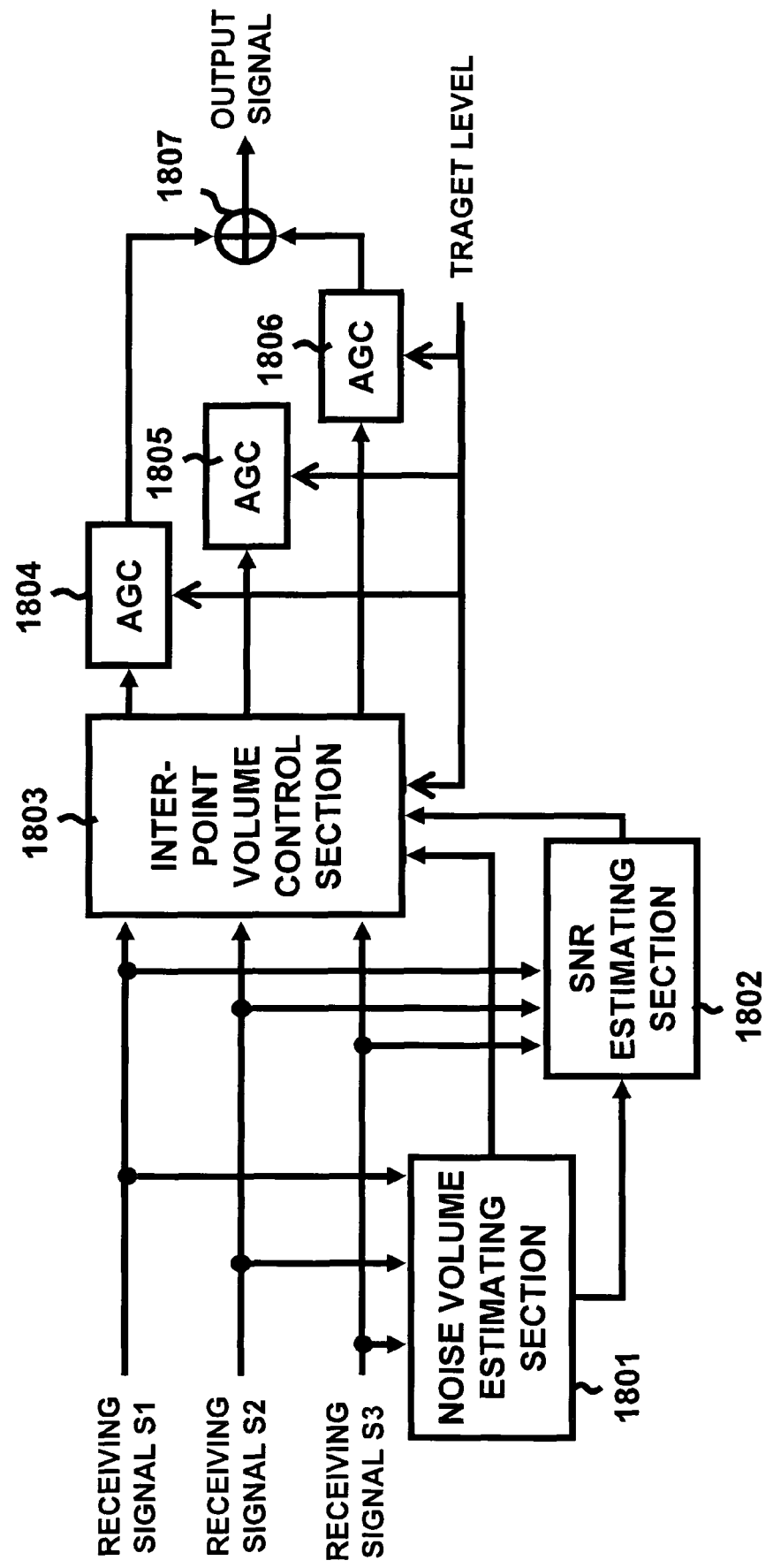
FIG. 15 is a structural view of a fourth multi-point teleconferencing apparatus.

FIG. 15 shows a still other exemplary configuration of the multi-point teleconferencing apparatus. A teleconference is carried out among four points in this case. This multi-point teleconferencing apparatus has a noise volume estimating section 1801, a SNR estimating section 1802, an inter-point volume control section 1803, AGCs 1804 through 1806 and a mixer 1807 and generates an output signal from three receiving signals S1 through S3 in the same manner with the multi-point teleconferencing apparatus in FIG. 12.

FIG. 16 shows exemplary volume control in the multi-point teleconferencing apparatus in FIG. 15. The noise volume estimating section 1801 calculates noise levels of the respective points at first and the SNR estimating section 1802 calculates SNRs of the respective point. Voice levels of the receiving signals S1, S2 and S3 are −10 dBov, −30 dBov and −40 dBov (1901), respectively, and noise levels thereof are −30 dBov, −60 dBov and −80 dBov (1902), respectively. Accordingly, SNRs thereof are 20 dB, 30 dB and 40 dB (1903), respectively.

Next, the inter-point volume control section 1803 subtracts a SNR maximum value of 40 dB from the target level (−25 dBov) to calculate a target noise level (−65 dBov) Then, it adjusts the receiving signals S1, S2 and S3 so that the respective noise levels coincide with the target noise level. Thereby, the voice levels of the receiving signals S1, S2 and S3 turn out to be −45 dBov, −35 dBov and −25 dBov (1904) and the noise level turns out to be −65 dBov (1905).

Next, the AGCs 1804 and 1805 amplify only the voice components of the receiving signals S1 and S2 to the target level (−25 dBov). Thereby, the voice level of the receiving signals S1, S2 and S3 turn out to be −25 dBov (1906). Meanwhile, the noise level is kept to be −65 dBov (1907).

Next, the mixer 1807 outputs the output signal by mixing the adjusted signals from the AGCs 1804 through 1806. A voice level of the generated output signal turns out to be −25 dBov (1908) and a noise level thereof turns out to be −65 dBov (1909).

FIG. 17 shows the prior art exemplary volume control shown in FIG. 20. Voice levels (2001) and noise levels (2002) of receiving signals S1, S2 and S3 are the same with those shown in FIG. 16 in this case. The AGCs adjust these receiving signals to the target level (−25 dBov). Thereby, voice levels of the receiving signals S1, S2 and S3 turn out to be −25 dBov (2003) and noise levels thereof turn out to be −45 dBov, −55 dBov and −65 dBov (2004), respectively.

Next, mixing is performed on the adjusted signals to generate an output signal. A voice level of the generated output signal turns out to be −25 dBov (2005) and a noise level thereof turns out to be −45 dBov (2006).

Thus, while the noise level after mixing is −45 dBov according to the prior art, it is 65 dBov according to the invention and the apparatus of the invention can lower the noise level.

Although FIGS. 12 and 15 show the configurations for processing the receiving signals from two and three points, respectively, the same applies to a configuration for processing receiving signals from four or more points.

Figure 18:
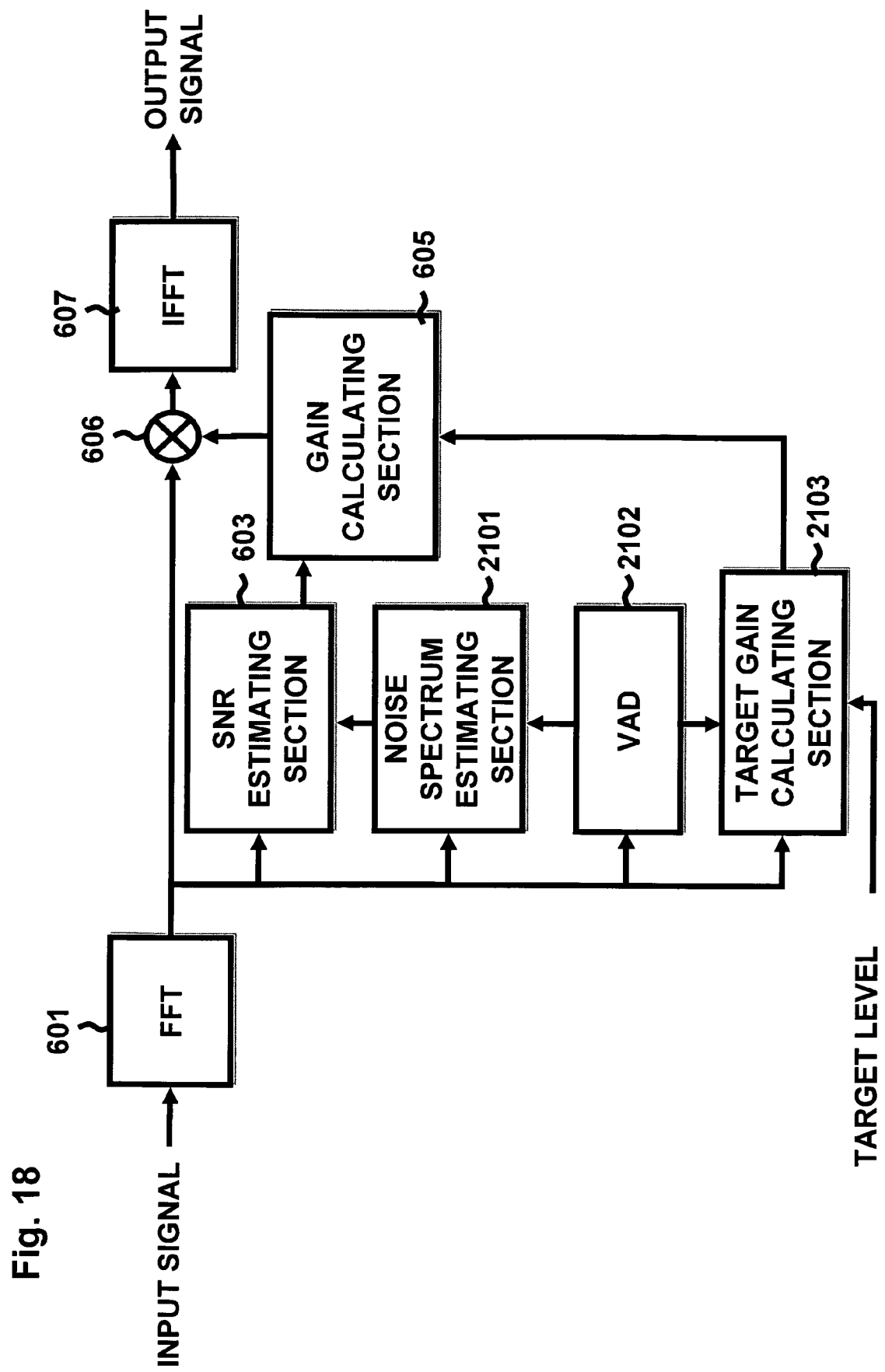
FIG. 18 is a structural view of a third AGC.
Figure 19:
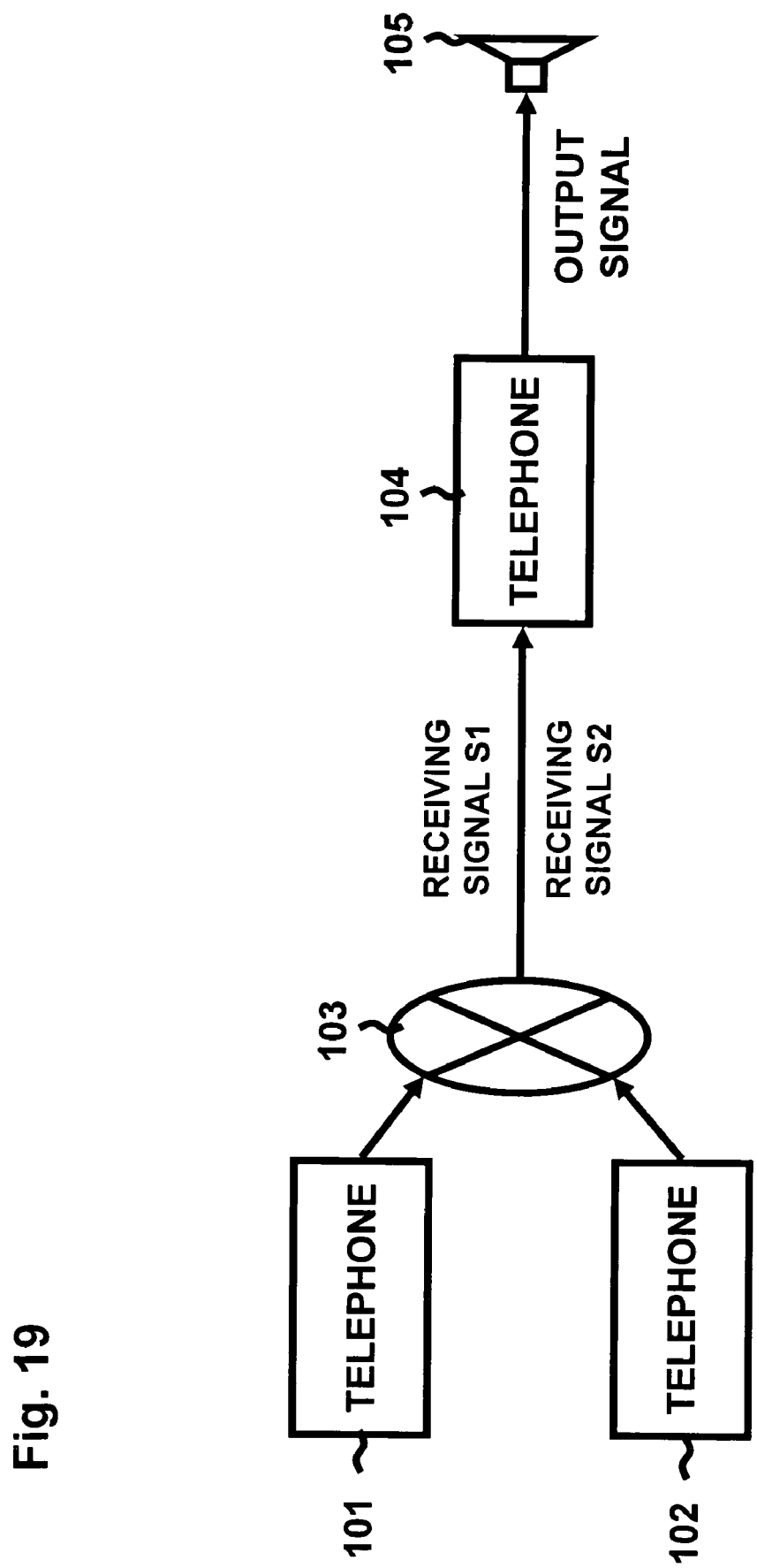
FIG. 19 is a structural view of a prior art multi-point teleconference system.

FIG. 18 shows another exemplary configuration of the AGCs shown in FIGS. 6, 9, 12 and 15. A voice action is detected based on an input spectrum instead of receiving signals in this configuration.

The AGC has the FFT 601, the SNR estimating section 603, the gain calculating section 605, the multiplier 606, the IFFT 607, a noise spectrum estimating section 2101, a VAD 2102 and a target gain calculating section 2103. Among them, operations of the FFT 601, the SNR estimating section 603, the gain calculating section 605, the multiplier 606 and the IFFT 607 are the same with those shown in FIG. 7.

The VAD 2102 detects voice sections and non-voice sections from the input spectrum and the noise spectrum estimating section calculates a noise spectrum from an average level of the non-voice sections and outputs it to the SNR estimating section 603. The target gain calculating section 2103 calculates an average voice level from an average level of the voice sections, calculates a target gain G0 from a ratio between the average voice level and the target level and outputs it to the gain calculating section 605.

By the way, voice may distort if the voice is amplified to much by the AGC and the SNR drops if the voice is attenuated. Then, it is desirable to set upper and lower limits for the calculated target gain. When the calculated target gain exceeds the upper limit, the target gain is replaced with a value of the upper limit and when the calculated target gain is lower than the lower limit, the target gain is replaced with a value of the lower limit. Zero dB is used as the lower limit of the target gain for example.

The voice may also distort when the noise level of a certain point is too small because the SNR becomes large and a large gain is set and the voice is clipped when the noise level is too large in the multi-point teleconferencing apparatus. Then, it is desirable to provide a noise superimposing section for superimposing low level noise to a receiving signal inputted to the inter-point volume control section. Thereby, it becomes possible to assure noise of certain level or more for each point.

It is also possible to set upper and lower limits for the noise level of each point, instead of superimposing the low level noise. In this case, when the noise level exceeds the upper limit, the noise level is replaced with a value of the upper limit and when the noise level is lower than the lower limit, the noise level is replaced with a value of the lower limit.

Although the target gain calculating section within the AGC has calculated the target gain from the target level common to the all bands in the embodiments described above, it is also possible, instead of that, to calculate the target gain different per each band from the target level different per each band.

Still more, although the AGC has performed the automatic gain control based on the power spectrum of the input sound, it may perform the automatic gain control based on an amplitude spectrum of the input sound instead. In this case, the FFT outputs the amplitude spectrum of the input sound as an input spectrum and the multiplier generates an output spectrum by multiplying G(i) with the i-th band in the input spectrum.

A multipoint communication apparatus also achieves the performance of adjusting gains of signals receiving from a plurality of other communication apparatuses by processing at a CPU in the multipoint communication apparatus.

What is claimed is:

1. A method to adjust a sound signal comprising:
estimating a plurality of signal-to-noise ratios of each of a plurality of bands from a ratio between an input spectrum and a noise spectrum respectively;
calculating a plurality of gains of each band from a target gain and a signal-to-noise ratio of each of the plurality of bands respectively;
setting the target gain as an upper limit value when the target gain is larger than the upper limit value; and
multiplying a signal level of each of the plurality of bands with the gain of each band respectively, to find a plurality of output levels of each band.

2. The method according to claim 1, wherein the sound signal is adjusted automatically.

3. A method to adjust a sound signal comprising:
estimating a plurality of signal-to-noise ratios of each of a plurality of bands from a ratio between an input spectrum and a noise spectrum respectively;
calculating a plurality of gains of each band from a target gain and a signal-to-noise ratio of each of the plurality of bands respectively;
setting the target gain as a lower limit value when the target gain is smaller than the lower limit value; and
multiplying a signal level of each of the plurality of bands with the gain of each band respectively, to find a plurality of output levels of each band.

4. The method according to claim 3, wherein the sound signal is adjusted automatically.

5. A volume control unit comprising:
a spectrum generating unit to divide an input signal containing voice volume elements and noise volume elements into a plurality of bands and generating a plurality of input spectra representing a signal level of each band respectively;
a noise spectrum estimating unit to find a plurality of noise spectra representing a noise level of each band from the signal level of each of the plurality of bands respectively;
a signal-to-noise ratio estimating unit to find a plurality of signal-to-noise ratios of each band from a ratio between an input spectrum and a noise spectrum respectively;
a gain calculating unit to find a plurality of gains of each band from a target gain and the signal-to-noise ratio of each of the plurality of bands respectively;
a target gain calculating unit to find the target gain, setting the target gain as an upper limit value when the target gain is larger than the upper limit value and setting the target gain as a lower limit value when the target gain is smaller than the lower limit value; and
a multiplier to find a plurality of output levels of each of the plurality of bands by multiplying the signal level of each band with the gain of each band, respectively.

6. The volume control unit according to claim 5, wherein the target gain is calculated from a target volume and the volume of the input signal.

7. The volume control unit according to claim 5, wherein the target gain is calculated from a target volume and the signal level of each band.

* * * * *

UNITED STATES PATENT AND TRADEMARK OFFICE
CERTIFICATE OF CORRECTION

| | | |
|---|---|---|
| PATENT NO. | : 8,218,777 B2 | Page 1 of 1 |
| APPLICATION NO. | : 12/155828 | |
| DATED | : July 10, 2012 | |
| INVENTOR(S) | : Takeshi Otani | |

It is certified that error appears in the above-identified patent and that said Letters Patent is hereby corrected as shown below:

Title Page, Item (57), Col. 2 (Abstract), Line 14, After "the" delete "a".

Signed and Sealed this
Second Day of October, 2012

David J. Kappos
*Director of the United States Patent and Trademark Office*